United States Patent
Gora

(10) Patent No.: US 10,637,489 B1
(45) Date of Patent: Apr. 28, 2020

(54) DETECTING SIGNAL DISTURBANCE USING ASYNCHRONOUS COUNTER

(71) Applicant: Infineon Technologies AG, Neubiberg (DE)

(72) Inventor: Witold Gora, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/432,779

(22) Filed: Jun. 5, 2019

(51) Int. Cl.
*H03L 7/00* (2006.01)
*H03M 1/06* (2006.01)
*G01S 7/02* (2006.01)
*H03K 3/0233* (2006.01)

(52) U.S. Cl.
CPC .......... *H03M 1/0624* (2013.01); *G01S 7/023* (2013.01); *H03K 3/02337* (2013.01); *H03M 1/0626* (2013.01)

(58) Field of Classification Search
CPC ... H03M 1/0624; H03M 1/0626; G01S 7/023; H03K 3/02337
USPC ....................................................... 327/160
See application file for complete search history.

(56) References Cited

U.S. PATENT DOCUMENTS

| | | | | |
|---|---|---|---|---|
| 4,726,291 A * | 2/1988 | Lefranc | .................. | F42C 13/04 102/214 |
| 5,258,615 A * | 11/1993 | Thorley | ................. | G01M 11/33 250/225 |
| 5,471,212 A * | 11/1995 | Sharpe | .................... | G01S 13/74 342/42 |
| 5,809,142 A * | 9/1998 | Hurta | ................. | G06Q 20/3676 340/928 |
| 9,374,070 B2 * | 6/2016 | Higuchi | ................. | H04N 5/357 |
| 2011/0114827 A1 * | 5/2011 | Yamaoka | ............... | H03K 4/026 250/214 R |
| 2012/0320246 A1 * | 12/2012 | Ikuma | .................. | H04N 5/3575 348/300 |
| 2016/0118971 A1 * | 4/2016 | Sugiyama | ............. | H03K 5/249 345/691 |

OTHER PUBLICATIONS

"ISO 26262," Wikipedia, the free encyclopedia, retrieved from https://en.wikiepdia.org/wiki/ISO_26262, last edit May 12, 2019, 7 pp.

* cited by examiner

*Primary Examiner* — Ryan Jager
(74) *Attorney, Agent, or Firm* — Shumaker & Sieffert, P.A.

(57) ABSTRACT

A circuit for detecting a signal disturbance comprising a high-pass filter, a comparator, an asynchronous counter, a synchronizer, and processing circuitry. The high-pass filter is configured to generate a filtered signal from a monitored signal. The comparator is configured to generate a compare result signal based on a comparison of the filtered signal and a threshold reference. The asynchronous counter is configured to generate a count value of threshold crossings based on the compare result signal. The synchronizer is configured to generate a synchronous output signal for storage at digital memory that is based on the count signal value. The processing circuitry is configured to determine that a disturbance has occurred at the monitored signal based on the synchronous output signal.

20 Claims, 11 Drawing Sheets

DETECTING SIGNAL DISTURBANCE USING ASYNCHRONOUS COUNTER

TECHNICAL FIELD

This disclosure relates to techniques for detecting signal disturbances resulting from, for example, electro-magnetic interferences, load changes, or switching activities.

BACKGROUND

Diagnostic systems detect and quantify a signal disturbance when a disturbance exceeds critical parameters of the diagnostic system. A high performance Analog-to-Digital Converter (ADC) with signal post processing can detect analog samples of a signal, convert the analog samples to digital values, and perform, using digital circuitry, signal post-processing on the digital values to detect a signal disturbance in the signal. The diagnostic system can be set with a sampling frequency that balances a capability to detect higher frequency signal disturbances and a cost of the diagnostic system.

SUMMARY

In general, this disclosure is directed to techniques for detecting signal disturbances in a continuous time (e.g., analog) domain. For example, a circuit may generate a compare result signal based on a comparison of a monitored signal and a threshold reference. In this example, an asynchronous counter generates a count value of threshold crossings based on the compare result signal. A synchronizer generates a synchronous output signal for storage at digital memory based on the count signal value. In this way, the circuit may detect signal disturbances in the continuous time domain, for example, using sequential logic to allow detection of high frequency signal disturbances while minimizing a cost of the diagnostic system compared to systems relying on a high performance (e.g., high frequency) Analog-to-Digital Converter (ADC) and signal post-processing.

In an example, a circuit for detecting a signal disturbance includes a high-pass filter configured to generate a filtered signal from a monitored signal, a comparator configured to generate a compare result signal based on a comparison of the filtered signal and a threshold reference, an asynchronous counter configured to generate a count value of threshold crossings based on the compare result signal, a synchronizer configured to generate a synchronous output signal for storage at digital memory that is based on the count signal value, and processing circuitry configured to determine that a disturbance has occurred at the monitored signal based on the synchronous output signal.

In another example, a method for detecting a signal disturbance includes generating, with a high-pass filter, a filtered signal from a monitored signal, generating a compare result signal based on a comparison of the filtered signal and a threshold reference, generating a count value of threshold crossings based on the compare result signal, generating, based on the count signal value, a synchronous output signal that changes according to a clock cycle, and determining that a disturbance has occurred at the monitored signal based on the synchronous output signal.

In another example, a system includes a device configured to generate a monitored signal, a high-pass filter configured to generate a filtered signal from the monitored signal, a comparator configured to generate a compare result signal based on a comparison of the filtered signal and a threshold reference, an asynchronous counter configured to generate a count value of threshold crossings based on the compare result signal, a synchronize configured to generate a synchronous output signal for storage at digital memory that is based on the count signal value, and processing circuitry configured to determine that a disturbance has occurred at the monitored signal based on the synchronous output signal.

Details of these and other examples are set forth in the accompanying drawings and the description below. Other features, objects, and advantages will be apparent from the description and drawings, and from the claims.

DETAILED DESCRIPTION

This disclosure is directed to techniques for detecting signal disturbances in a continuous time (e.g., analog) domain. For example, a circuit may perform detection and initial processing of information of a signal in the continuous time domain, which permit detection of higher frequency signal disturbances compared to systems relying solely on clocked (e.g., digital) circuits where a clock rate limits a measurement performance and/or a compute performance. For instance, the circuit may perform detection and initial processing of information of a signal in the continuous time domain may include an asynchronous counter that includes sequential logic (e.g., latches) configured to directly process an asynchronous output of an analog comparator (or other kind of device for analog streaming) and output a count value to a synchronizer.

A circuit configured to perform detection and initial processing of information of a signal in the continuous time domain may asynchronously detect and process events of voltage or current level transitions crossing a specified threshold level and produce statistical information of the measured signal at a very high rate compared to systems that rely solely on clocked (e.g., digital) circuits. The circuit configured to perform detection and initial processing of information of a signal in the continuous time domain may detect deviations of the signal from an anticipated level within a finite period of time. In such circuits, the detection of the signal changes is performed in continuous time domain while the output of the detection result may be periodically transferred to a discrete time domain serving the interface to, for example, a computer, microcontroller, or another digital device for further processing of the information. At the end of the measurement period "T", the circuit may output the quantified information about the detections in the form of, for example, an occurrence count or a further preprocessed representation.

Figure 1:
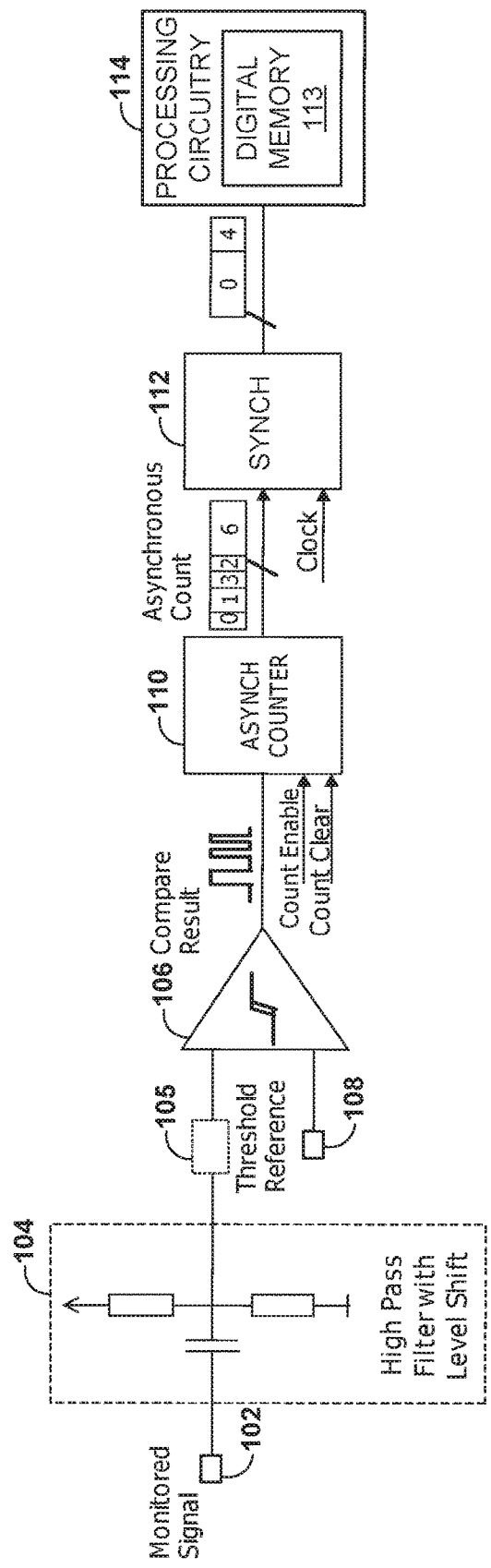
FIG. 1 is a block diagram illustrating an example system, in accordance with one or more techniques of this disclosure.

FIG. 1 is a block diagram illustrating an example system, in accordance with one or more techniques of this disclosure. As illustrated in the example of FIG. 1, circuit 100 may include device 102, high-pass filter 104, comparator 106, asynchronous counter 110 ("asynch counter 110"), synchronizer 112 ("sync 112"), and processing circuitry 114. As shown, processing circuitry 114 may include digital memory 113.

Device 102 may be configured to generate a monitored signal. For example, device 102 may be configured to generate a wireless signal that is monitored for general noise reduction during radio frequency (RF) activities. Device 102 may be configured to generate a signal for general electromagnetic interference (EMI) monitoring (e.g. general EMI measurements in various electronic equipment testing). Device 102 may be configured to generate a signal for powerline monitoring (e.g. a power line quality, a presence of disturbance in power line-based communication, etc.). Device 102 may be configured to generate a signal for wired communication (e.g. signal integrity monitoring in wired communication systems). Device 102 may be configured to generate a signal for chip card security (e.g. a monitoring of electro-magnetic immunity in embedded security systems). Device 102 may be configured to generate a signal for functional safety mechanisms in the form of redundancy and/or high performance of problem detectability. For example, device 102 may be configured to provide one or more safety mechanisms to support ISO 26262 Road Vehicles—Functional Safety. November 2011. ISO, Geneva, Switzerland. http://www.iso.org.

High-pass filter 104 may be configured to generate a filtered signal from a monitored signal. For example, high-pass filter 104 may attenuate components of the monitored signal signals comprising a frequency less than a threshold frequency of high-pass filter 104. For instance, high-pass filter 104 may be configured to "level shift" the monitored signal to remove a DC offset and attenuate low frequency components of the monitored signal that have a frequency less than the threshold frequency. In some examples, high-pass filter 104 may attenuate components of the monitored signal comprising a frequency of less ten times an operating frequency of processing circuitry 114. In this way, high-pass filter 104 may be configured to expose signal properties of interest, e.g. remove a signal offset while keeping only a high frequency component.

In some examples, circuit 100 may optionally include amplifier 105, which may be configured to amplify the filtered signal before output to comparator 106. Examples of amplifier 105 may include, for example, but are not limited to, a common emitter Bipolar Junction Transistor (BJT) amplifier or other amplifiers. Although the example of FIG. 1 illustrates amplifier 105 as being between high-pass filter 104 and comparator 106, in some examples, an amplifier may be additionally, or alternatively, arranged between device 102 and high-pass filter 104.

Comparator 106 configured to generate a compare result signal based on a comparison of the filtered signal output by high-pass filter 104 and a threshold reference 108. Comparator 106 may implement a hysteresis in order to filter out small spikes according to the desired effect. For example, comparator 106 may be a hysteresis comparator. For example, comparator 106 may be configured to transition from a first state (e.g., logical '0' output) to a second state (e.g., logical '1' output) when voltage at the filtered signal transitions from less than threshold reference 108 to voltage that is greater than threshold reference 108 plus a tolerance and configured to transition from the second state to the first state when voltage at the filtered signal transitions from greater than threshold reference 108 to voltage that is less than threshold reference 108 minus the tolerance.

Asynchronous counter 110 may be configured to generate a count value of threshold crossings (e.g., positive crossings, negative crossings, or positive and negative crossings) based on the compare result signal output by comparator 106. Asynchronous counter 110 may include sequential logic (e.g., latches) that may be implemented analog components, digital components, or a combination of analog and digital components. In some examples, asynchronous counter 110 may include a gray counter configured to generate the count value using gray code. For example, asynchronous counter 110 may be configured to change only one bit per count increment. For instance, asynchronous counter 110 may be configured to count the sequence 0, 1, 2, 3, 4, as "0000", "0001", "0011", "0010", "0110".

Synchronizer 112 may be configured to generate a synchronous output signal for storage at digital memory 113 of processing circuitry 114 that is based on the count signal value output by asynchronous counter 110. For example, synchronizer 112 may synchronize the output of asynchronous counter 110 to a clocked domain (used by processing circuitry 114 and/or digital memory 113) for further processing of the result. Synchronizer 112 may include meta-stability protection for synchronization. For example, the meta-stability protection can be implemented using regular e.g. CMOS technology for data synchronization to a clock of the clocked part (e.g., processing circuitry 114 and/or digital memory 113) of circuit 100. In some examples, synchronizer 112 may implement meta-stability protection using a pair of flip-flops per counter bit when asynchronous counter 110 uses gray code where only one bit can flip at each increment.

Processing circuitry 114 may be configured to determine that a disturbance has occurred at the monitored signal based on the synchronous output signal. In some examples, processing circuitry 114 may be configured to determine a corrective action based on the synchronous output signal. Processing circuitry 114 may be a microcontroller on a single integrated circuit containing a processor core, memory, inputs, and outputs. For example, processing circuitry 114 may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. In some examples, processing circuitry 114 may be a combination of one or more analog components and one or more digital components.

Figure 2:
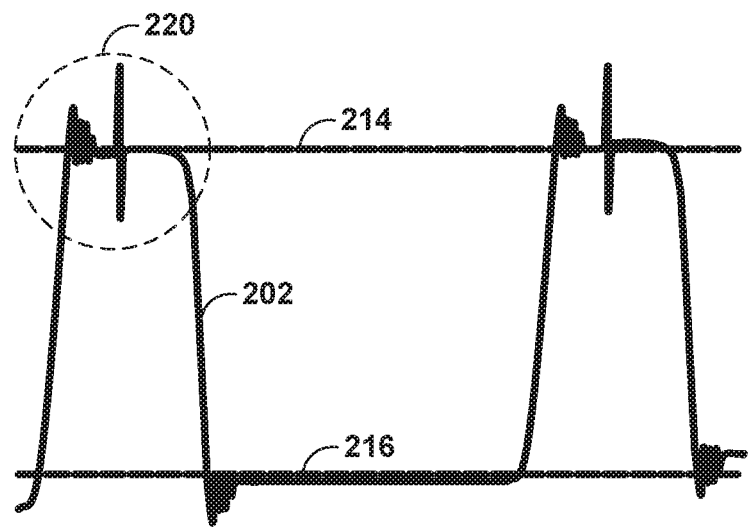
FIG. 2 is a conceptual diagram illustrating a signal disturbance of a monitored signal, in accordance with one or more techniques of this disclosure.

FIG. 2 is a conceptual diagram illustrating a signal disturbance of monitored signal 202, in accordance with one or more techniques of this disclosure. As used herein, signal disturbances may have one or more of: a frequency spectrum beyond ADC sampling capabilities, a random and abrupt character, a very short duration, and/or a repetitive or non-repetitive character. In the example of FIG. 2, device 102 outputs monitored signal 202, which changes between first level 214 (e.g., logical '1') and second level 216 (e.g., logical '0'). As shown, monitored signal 202 may include a signal disturbance 220. Signal disturbance 220 may have a relatively high frequency compared to an operating frequency of processing circuitry 114. For example, signal disturbance 220 may have a frequency that is greater than 100 MHz and processing circuitry 114 may have an operating frequency of less than 10 MHz.

Figure 3:
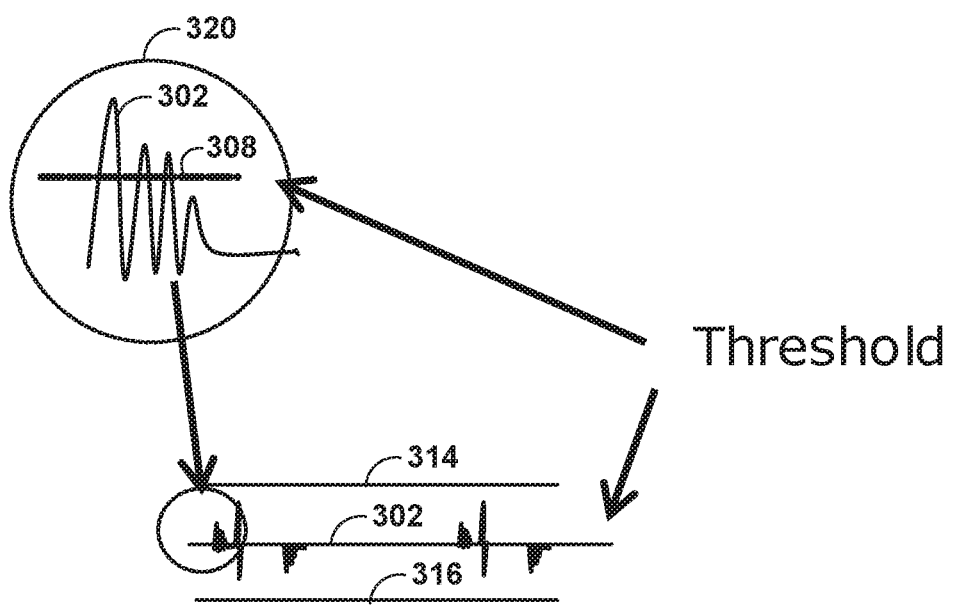
FIG. 3 is a conceptual diagram illustrating a signal disturbance of a filtered signal, in accordance with one or more techniques of this disclosure.

FIG. 3 is a conceptual diagram illustrating a signal disturbance of filtered signal 302, in accordance with one or more techniques of this disclosure. In the example of FIG. 3, high-pass filter 104 outputs filtered signal 302, which, before filtering, changed between first level 314 (e.g., logical '1') and second level 316 (e.g., logical '0'). As shown, filtered signal 302 may include a signal disturbance 320, which crosses threshold reference 308. In this example, comparator 106 may be configured to generate a compare result signal based on a comparison of the filtered signal and threshold reference 308 and asynchronous counter 110 may be configured to configured to generate a count value of threshold crossings (e.g., positive crossing, negative crossing, or positive and negative crossings) based on the compare result signal.

Figure 4:
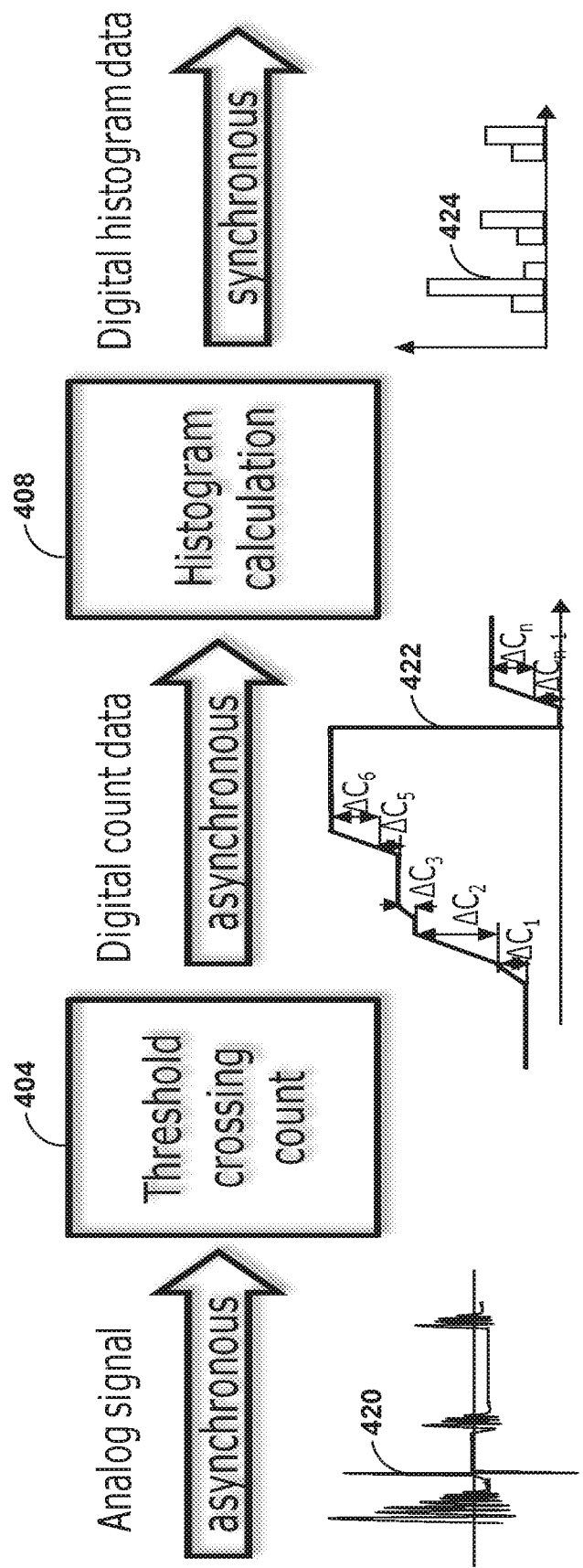
FIG. 4 is a conceptual diagram illustrating detection of a signal disturbance in the continuous time domain, in accordance with one or more techniques of this disclosure.

FIG. 4 is a conceptual diagram illustrating detection of a signal disturbance in the continuous time (e.g., analog) domain, in accordance with one or more techniques of this disclosure. In the example of FIG. 4, asynchronous counter 110 receives asynchronous filtered signal 420 in the continuous time domain, generates a threshold crossing count 404, and generates asynchronous signal 422 specifying the count value of threshold crossings in the continuous time domain. Synchronizer 112 receives asynchronous signal 422, generates a digital histogram of count values 408, and outputs synchronous signal 424 specifying the digital histogram of count values in the discrete time (e.g., digital) domain.

Figure 5:
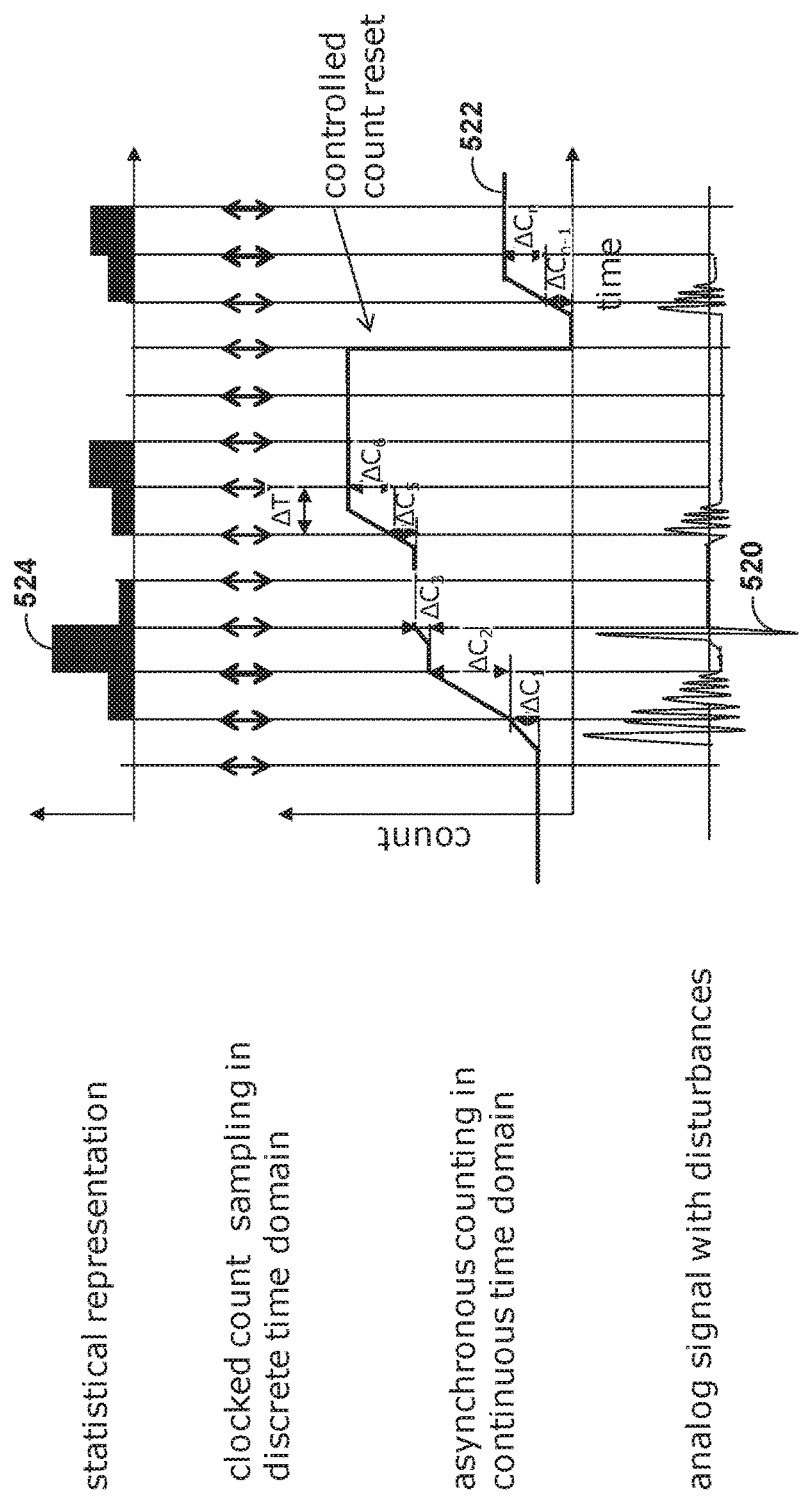
FIG. 5 is a conceptual diagram illustrating a digital histogram of values generated for detection of a signal disturbance, in accordance with one or more techniques of this disclosure.

FIG. 5 is a conceptual diagram illustrating a digital histogram of values generated for detection of a signal disturbance, in accordance with one or more techniques of this disclosure. In the example of FIG. 5, asynchronous counter 110 receives asynchronous filtered signal 520 in the continuous time domain and generates asynchronous signal 522 specifying the count value of threshold crossings in the continuous time domain. For example, as shown, asynchronous counter 110 may increment the count multiple times during a single clock cycle. Synchronizer 112 receives asynchronous signal 522 and outputs synchronous signal 524 specifying the digital histogram of count values in the discrete time domain. As shown, each bin of the digital histogram corresponds to a count value of threshold crossings during the previous clock cycle.

In this way, circuit 100 may be configured to generate, in the continuous time domain, the count value of threshold crossings and analyze, in the discrete time domain, a high frequency component of a monitored signal, which may allow for higher frequency components of the monitored signal to be detected with lower power consumption compared to synchronous logic for the same input frequency. In some examples, processing circuitry 114 may be configured to extract information about the length and frequency of the noise detected by comparator 106 and/or asynchronous counter 110 and can be configured to trigger further actions.

As such, circuit 100 may have an improved performance compared to clocked systems, may not be limited by the Nyquist sampling frequency (e.g., Nyquist theorem), may be simple to implement, may provide a real time response, may provide time domain localization of the disturbances, may use a low computation effort compared to synchronous logic for the same input frequency, and/or may have a low cost implementation compared to synchronous logic for the same input frequency.

Figure 6:
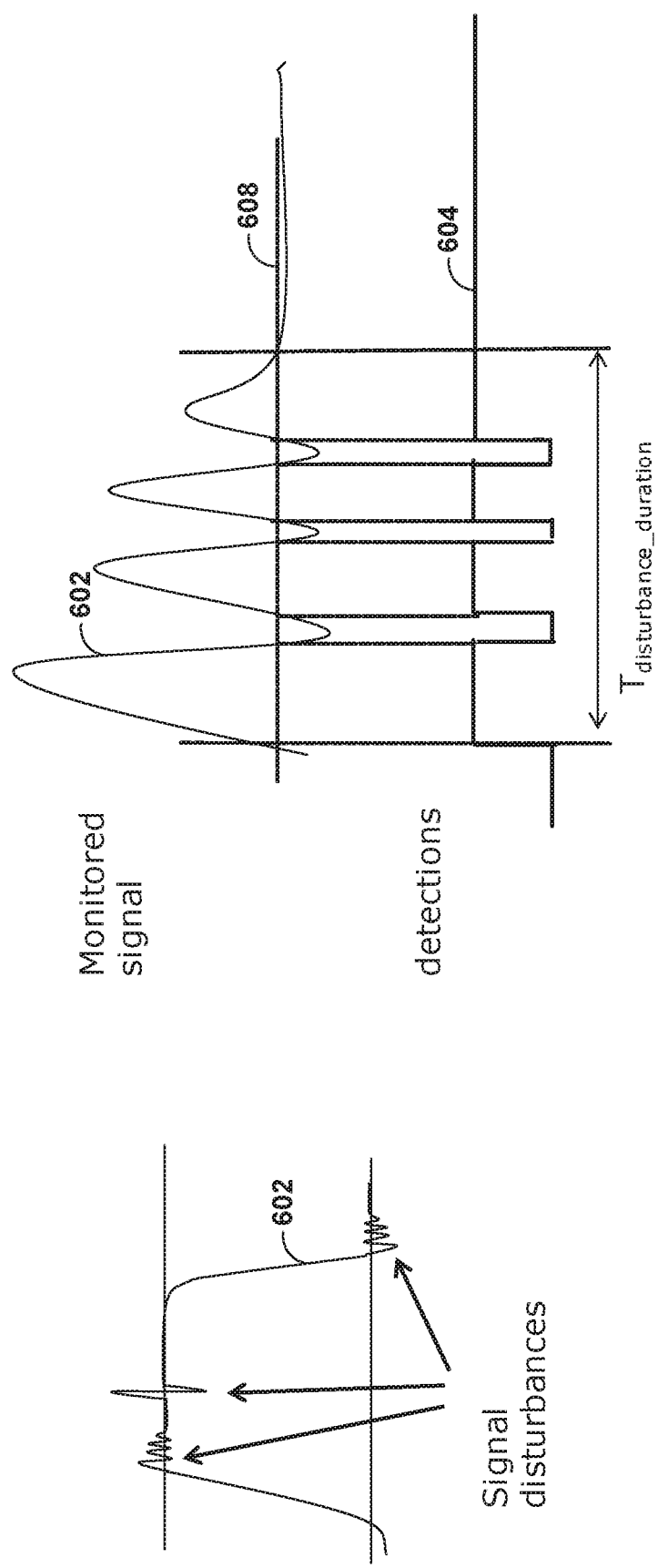
FIG. 6 is a conceptual diagram illustrating a disturbance duration of a signal disturbance, in accordance with one or more techniques of this disclosure.

FIG. 6 is a conceptual diagram illustrating a disturbance duration of a signal disturbance, in accordance with one or more techniques of this disclosure. In the example of FIG. 6, device 102 outputs monitored signal 602 with signal disturbances. In this example, comparator 106 generates a compare result signal 604 indicating whether monitored signal 602 is above threshold reference 608 or below within a small (e.g., less than 10 ns) disturbance duration ("Tdistrubance_duration").

Figure 7:
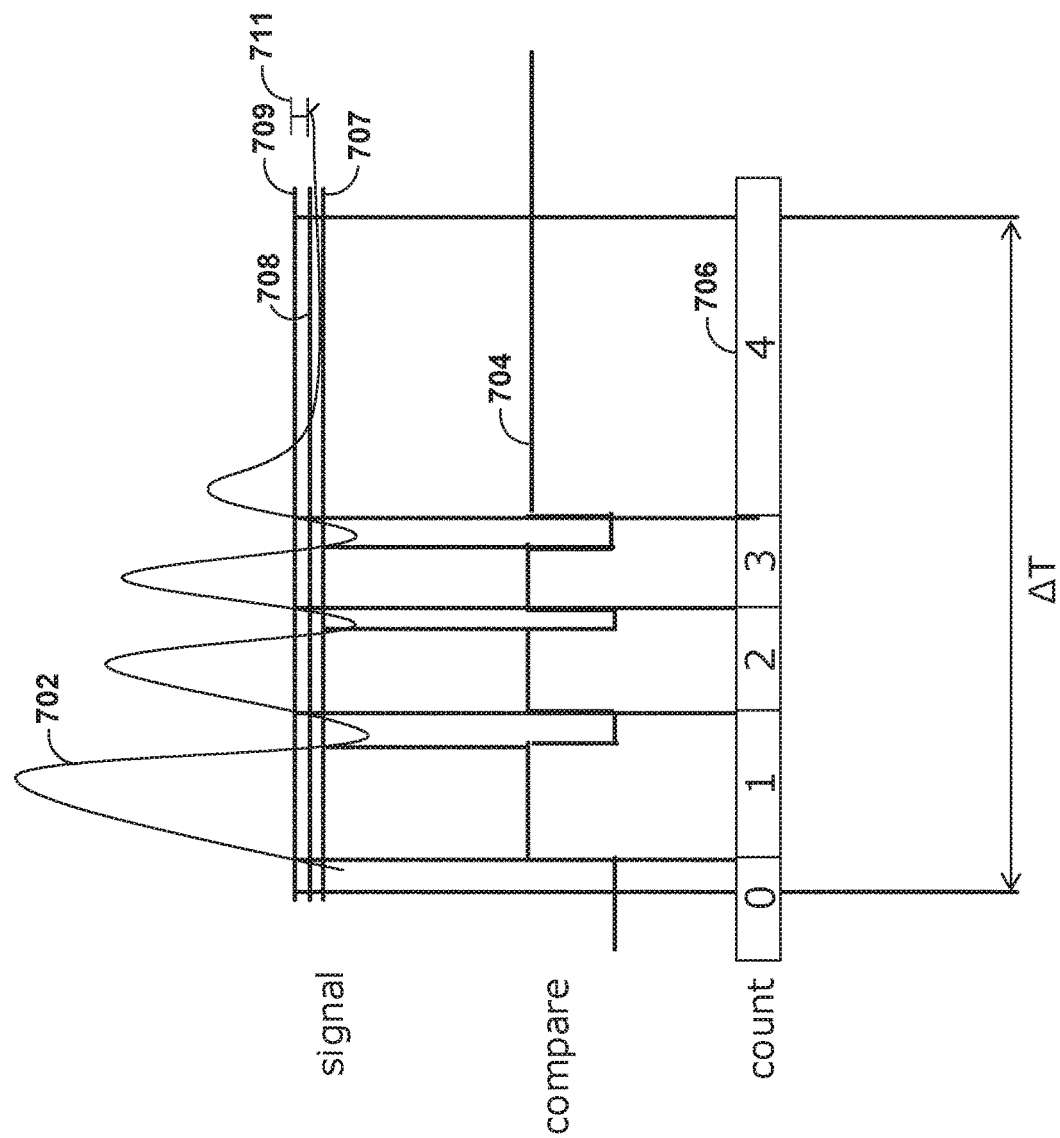
FIG. 7 is a conceptual diagram illustrating a process for determining a count value of threshold crossings, in accordance with one or more techniques of this disclosure.

FIG. 7 is a conceptual diagram illustrating a process for determining a count value of threshold crossings, in accordance with one or more techniques of this disclosure. In the example of FIG. 7, device 102 outputs monitored signal 702 with signal disturbances.

In the example of FIG. 7, comparator 106 generates a compare result signal 704. More specifically, in this example, comparator 106 is a hysteresis comparator. For example, comparator 106 may be configured to transition from a first state (e.g., logical '0' output) to a second state (e.g., logical '1' output) when voltage at filtered signal 702 transitions from less than first threshold reference 709 to greater than first threshold reference 709 and to transition from the second state to the first state when voltage at filtered signal 702 transitions from greater second threshold reference 707 to less than second threshold reference 707. As shown, first threshold reference 709 is greater than threshold reference 708 by tolerance 711 and second threshold reference 709 is less than threshold reference 708 by tolerance 711.

In response to compare result signal 704, asynchronous counter 110 increments a count value 706 of threshold crossings. In the example of FIG. 7, asynchronous counter 110 increments a count value 706 of positive threshold crossings. For example, asynchronous counter 110 increments the count value when comparator 106 transitions compare result signal 704 from a first state (e.g., logical '0') to a second state (e.g., logical '1') and refrains from incrementing count value 706 when comparator 106 transitions compare result signal 704 from the second state to the first state. However, in some examples, asynchronous counter 110 increments the count value when comparator 106 transitions compare result signal 704 from the second state (e.g., logical '1') to the first state (e.g., logical '0'). For example, asynchronous counter 110 increments count value 706 in response to negative threshold crossings or negative threshold crossings and positive threshold crossings.

Figure 8:
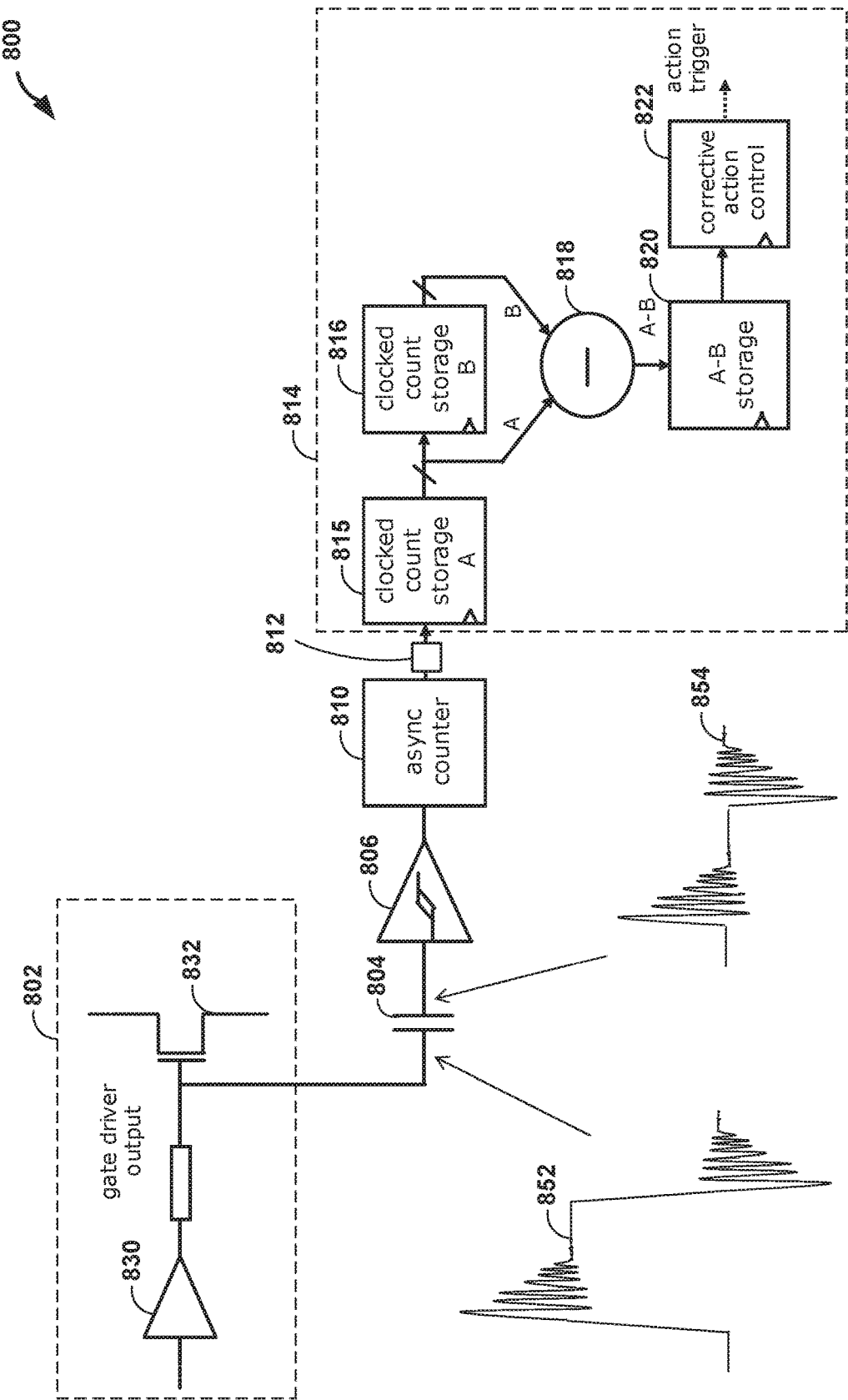
FIG. 8 is a conceptual diagram illustrating a circuit for determining a disturbance in a gate driver output signal, in accordance with one or more techniques of this disclosure.

FIG. 8 is a conceptual diagram illustrating circuit 800 for determining a disturbance in a gate driver output signal, in accordance with one or more techniques of this disclosure. Circuit 800 may include switching controller 802, high-pass filter 804, comparator 806, asynchronous counter 810, synchronizer 812, and processing circuitry 814, which may be examples of device 102, high-pass filter 104, comparator 106, asynchronous counter 110, synchronizer 112, and processing circuitry 114, respectively.

As shown, switching controller 802 includes gate driver 830 and switching element 832. Examples of switching elements may include, but are not limited to, a silicon-controlled rectifier (SCR), a Field Effect Transistor (FET), and a bipolar junction transistor (BJT). Examples of FETs may include, but are not limited to, a junction field-effect transistor (JFET), a metal-oxide-semiconductor FET (MOSFET), a dual-gate MOSFET, an insulated-gate bipolar transistor (IGBT), any other type of FET, or any combination of the same. Examples of MOSFETS may include, but are not limited to, a depletion mode p-channel MOSFET (PMOS), an enhancement mode PMOS, depletion mode n-channel MOSFET (NMOS), an enhancement mode NMOS, a double-diffused MOSFET (DMOS), any other type of MOSFET, or any combination of the same. Examples of BJTs may include, but are not limited to, PNP, NPN, heterojunction, or any other type of BJT, or any combination of the same. It should be understood that switching elements may be high-side or low-side switching elements. Additionally, switching elements may be voltage-controlled and/or current-controlled. Examples of current-controlled switching elements may include, but are not limited to, gallium nitride (GaN) MOSFETs, BJTs, or other current-controlled elements.

Processing circuitry 814 may include datastore 815, datastore 816, subtraction module 818, datastore 820, and correction action control module 822. Datastore 815, datastore 816, and datastore 820 may be arranged within one digital memory or within multiple digital memories. Switching controller 802 may be arranged with circuitry for power conversion, motor control, or other circuitry.

In the example of FIG. 8, high-pass filter 804 filters a gate driver output signal 852 output by gate driver 830 to generate a filtered signal 854. Comparator 806 generates a compare result signal based on a comparison of the filtered signal and a threshold reference. Asynchronous counter 810 generates a count value of threshold crossings based on the compare result signal. Synchronizer 812 generates a synchronous output signal for storage at datastore 815 that is based on the count signal value. Datastore 815 stores a first sample of the synchronous output signal. After a clock cycle, the first sample is stored at datastore 816 and datastore 815 stores a second sample of the synchronous output signal. Subtraction module 818 subtracts the second sample value of the synchronous output signal stored at datastore 815 from the first sample value stored at datastore 816. Datastore 820 stores the result of subtracting the second sample value of the synchronous output signal stored at datastore 815 from the first sample value stored at datastore 816. Corrective action control module 822 may determine a corrective action based on the count value stored at datastore 820. In some examples, corrective action control module 822 may output a trigger action based on the corrective action. For example, control module 822 may output a trigger action to switch-out switching element 832 when a switching disturbance is detected.

Figure 9:
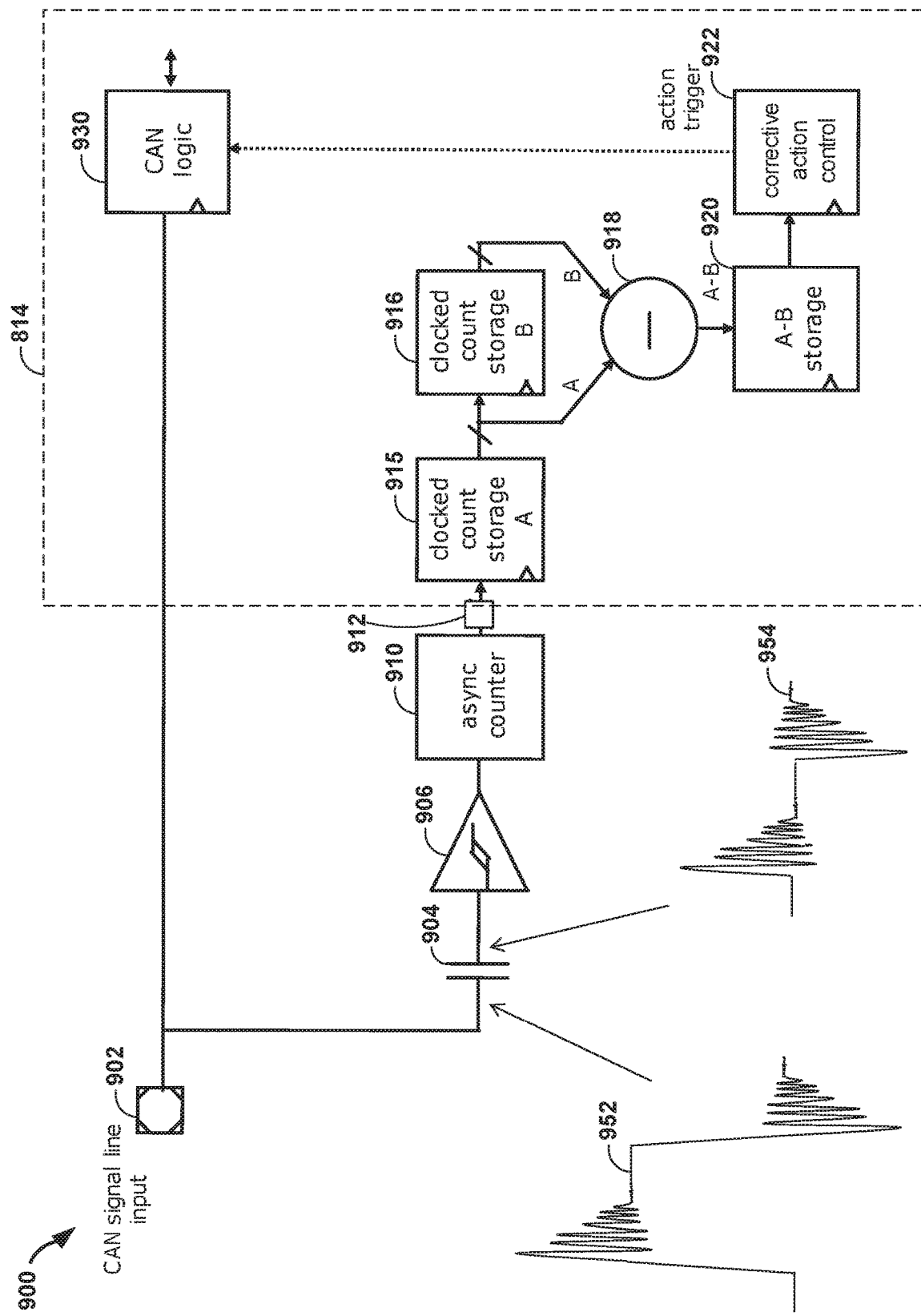
FIG. 9 is a conceptual diagram illustrating a circuit for determining a disturbance in a Controller Area Network (CAN) signal, in accordance with one or more techniques of this disclosure.

FIG. 9 is a conceptual diagram illustrating circuit 900 for determining a disturbance in a Controller Area Network (CAN) signal, in accordance with one or more techniques of this disclosure. Circuit 900 may include CAN device 902, high-pass filter 904, comparator 906, asynchronous counter 910, synchronizer 912, and processing circuitry 914, which may be examples of device 102, high-pass filter 104, comparator 106, asynchronous counter 110, synchronizer 112, and processing circuitry 114, respectively.

Processing circuitry 914 may include datastore 915, datastore 916, subtraction module 918, datastore 920, correction action control module 922, and CAN logic 930. Datastore 915, datastore 916, and datastore 920 may be arranged within one digital memory or within multiple digital memories.

In the example of FIG. 9, high-pass filter 904 filters a CAN signal 952 output by CAN device 902 to generate a filtered signal 954. Comparator 906 generates a compare result signal based on a comparison of the filtered signal and a threshold reference. Asynchronous counter 910 generates a count value of threshold crossings based on the compare result signal. Synchronizer 912 generates a synchronous output signal for storage at datastore 915 that is based on the count signal value. Datastore 915 stores a first sample of the synchronous output signal. After a clock cycle, the first sample is stored at datastore 916 and datastore 915 stores a second sample of the synchronous output signal. Subtraction module 918 subtracts the second sample value of the synchronous output signal stored at datastore 915 from the first sample value stored at datastore 916. Datastore 920 stores the result of subtracting the second sample value of the synchronous output signal stored at datastore 915 from the first sample value stored at datastore 916. Corrective action control module 922 may determine a corrective action based on the count value stored at datastore 920. In some examples, corrective action control module 922 may output a trigger action based on the corrective action to CAN logic 930. CAN logic 930 may determine a transmission error has occurred in response to the trigger action.

Figure 10:
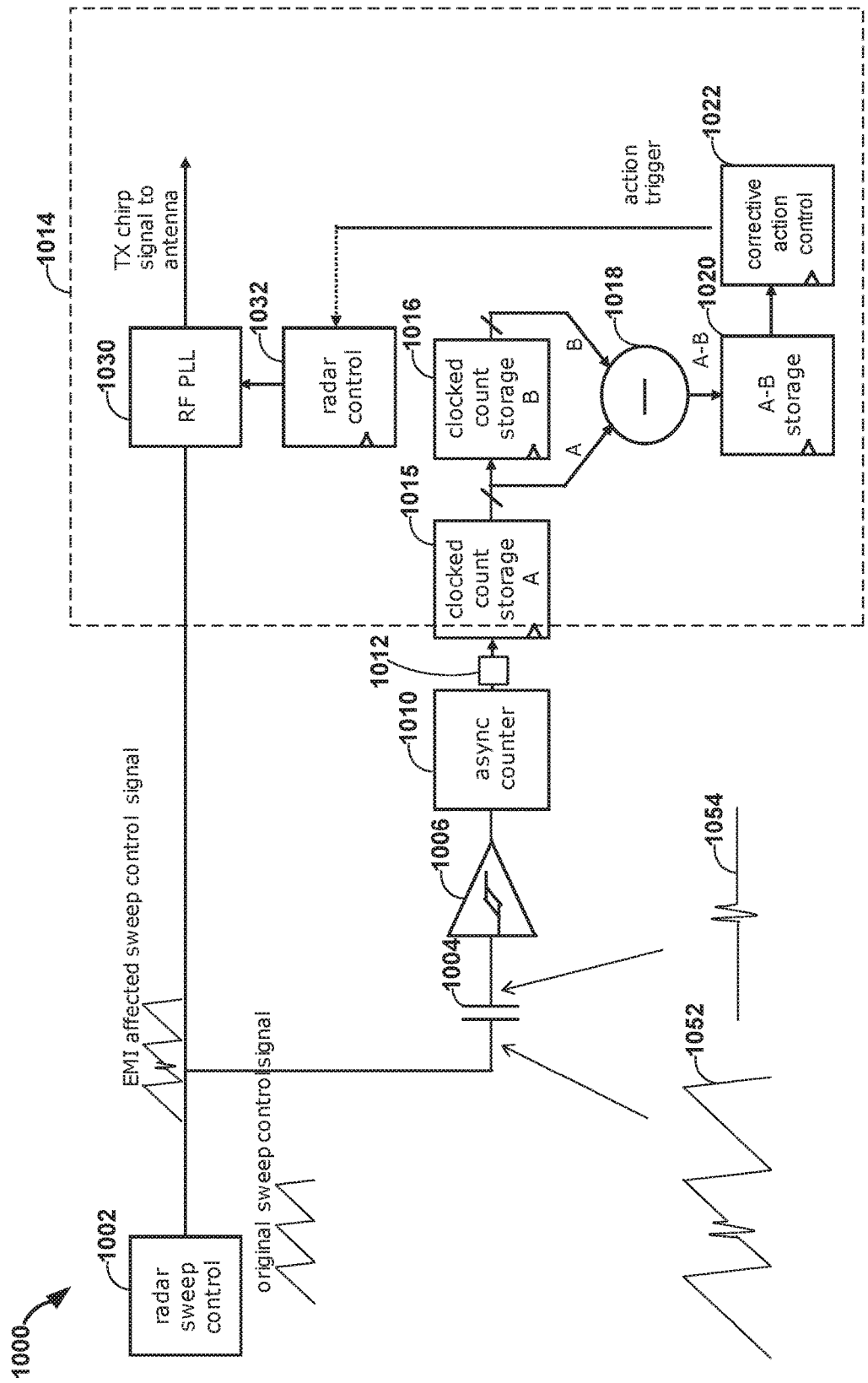
FIG. 10 is a conceptual diagram illustrating a circuit for determining a disturbance in a radar transmission sweep control signal, in accordance with one or more techniques of this disclosure.

FIG. 10 is a conceptual diagram illustrating circuit 1000 for determining a disturbance in a radar transmission sweep control signal, in accordance with one or more techniques of this disclosure. Circuit 1000 may include radar sweep controller 1002, high-pass filter 1004, comparator 1006, asynchronous counter 1010, synchronizer 1012, and processing circuitry 1014, which may be examples of device 102, high-pass filter 104, comparator 106, asynchronous counter 110, synchronizer 112, and processing circuitry 114, respectively.

Processing circuitry 1014 may include datastore 1015, datastore 1016, subtraction module 1018, datastore 1020, correction action control module 1022, and RF Phase-Locked Loop (PLL) 1030. Datastore 1015, datastore 1016, and datastore 1020 may be arranged within one digital memory or within multiple digital memories.

In the example of FIG. 10, high-pass filter 1004 filters a radar sweep control signal 1052 output by radar sweep controller 1002 to generate a filtered signal 1054. Comparator 1006 generates a compare result signal based on a comparison of the filtered signal and a threshold reference. Asynchronous counter 1010 generates a count value of threshold crossings based on the compare result signal. Synchronizer 1012 generates a synchronous output signal for storage at datastore 1015 that is based on the count signal value. Datastore 1015 stores a first sample of the synchronous output signal. After a clock cycle, the first sample is stored at datastore 1016 and datastore 1015 stores a second sample of the synchronous output signal. Subtraction module 1018 subtracts the second sample value of the synchronous output signal stored at datastore 1015 from the first sample value stored at datastore 1016. Datastore 1020 stores the result of subtracting the second sample value of the synchronous output signal stored at datastore 1015 from the first sample value stored at datastore 1016. Corrective action control module 1022 may determine a corrective action based on the count value stored at datastore 1020. In some examples, corrective action control module 1022 may output a trigger action based on the corrective action to radar control 1032. Radar control 1032 may control RF PLL 1030 to generate a Transmission (Tx) chirp for output to an antenna.

Figure 11:
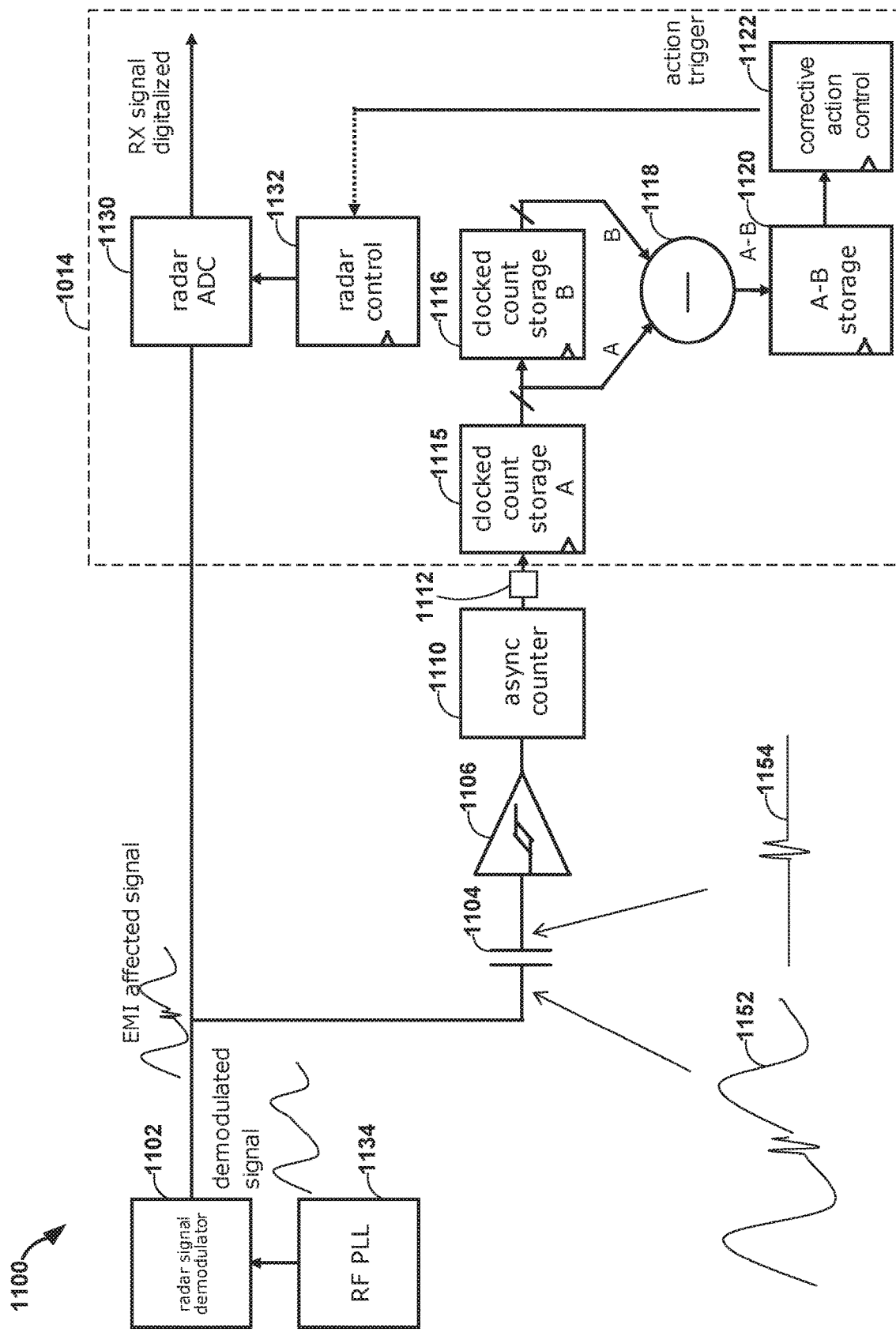
FIG. 11 is a conceptual diagram illustrating a circuit for determining a disturbance in a radar receiver demodulation signal, in accordance with one or more techniques of this disclosure.

FIG. 11 is a conceptual diagram illustrating circuit 1100 for determining a disturbance in a radar receiver demodulation signal, in accordance with one or more techniques of this disclosure. Circuit 1100 may include radar signal demodulator 1102, high-pass filter 1104, comparator 1106, asynchronous counter 1110, synchronizer 1112, and processing circuitry 1114, which may be examples of device 102, high-pass filter 104, comparator 116, asynchronous counter 110, synchronizer 112, and processing circuitry 114, respectively. Radar signal demodulator 1102 may be controlled by RF PLL 1134.

Processing circuitry 1114 may include datastore 1115, datastore 1116, subtraction module 1118, datastore 1120, correction action control module 1122, and radar ADC 1130. Datastore 1115, datastore 1116, and datastore 1120 may be arranged within one digital memory or within multiple digital memories.

In the example of FIG. 11, high-pass filter 1104 filters radar receiver demodulated signal 1152 output by radar sweep controller 1102 to generate a filtered signal 1154. Comparator 1106 generates a compare result signal based on a comparison of the filtered signal and a threshold reference. Asynchronous counter 1110 generates a count value of threshold crossings based on the compare result signal. Synchronizer 1112 generates a synchronous output signal for storage at datastore 1115 that is based on the count signal value. Datastore 1115 stores a first sample of the synchronous output signal. After a clock cycle, the first sample is stored at datastore 1116 and datastore 1115 stores a second sample of the synchronous output signal. Subtraction module 1118 subtracts the second sample value of the synchronous output signal stored at datastore 1115 from the first sample value stored at datastore 1116. Datastore 1120 stores the result of subtracting the second sample value of the synchronous output signal stored at datastore 1115 from the first sample value stored at datastore 1116. Corrective action control module 1122 may determine a corrective action based on the count value stored at datastore 1120. In some examples, corrective action control module 1122 may output a trigger action based on the corrective action to radar control 1132. Radar control 1132 may control a radar ADC 1130 to generate a Received (Rx) signal to be digitized.

Figure 12:
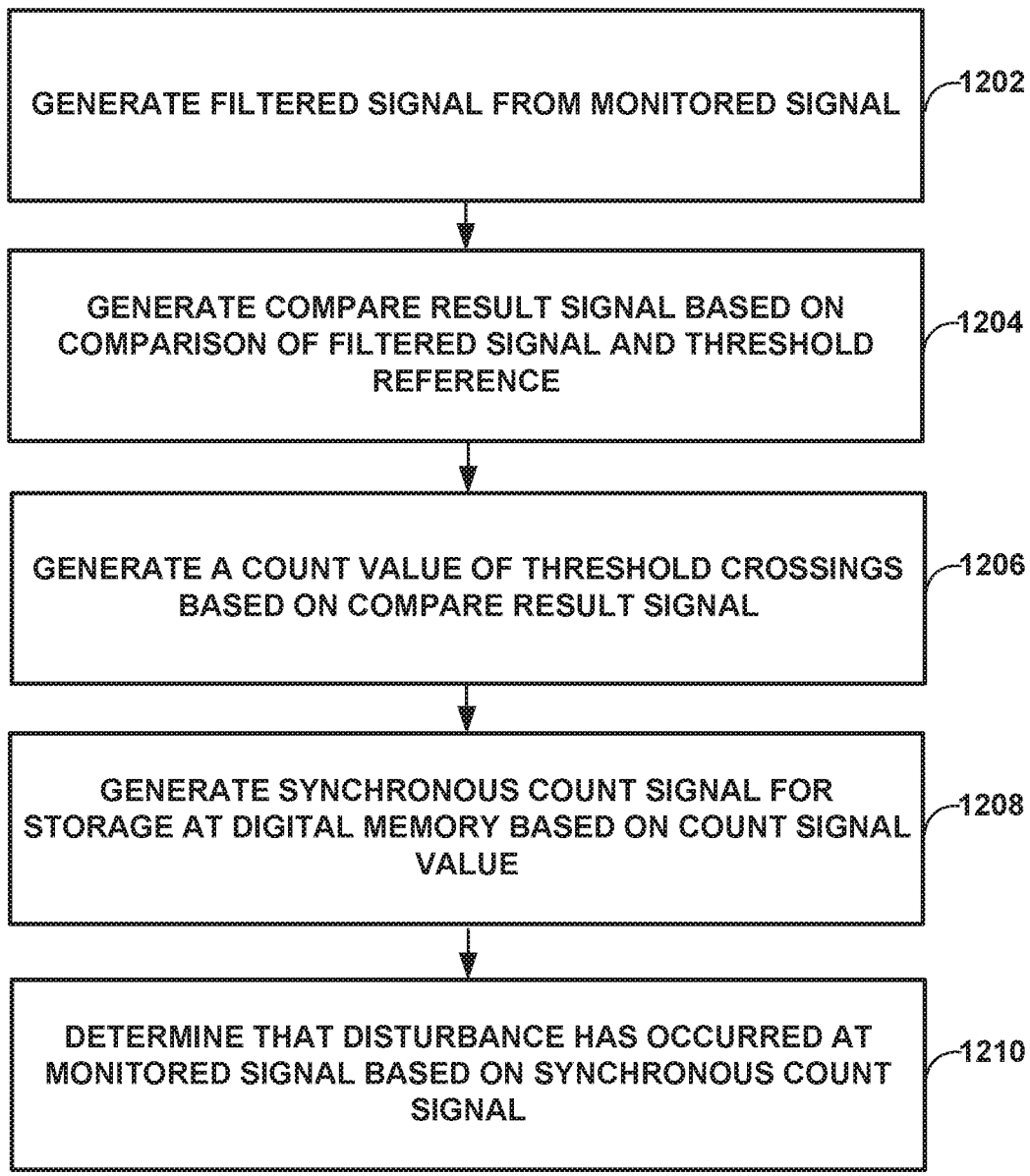
FIG. 12 is a flow diagram of a process for determining a signal disturbance, in accordance with this disclosure.

FIG. 12 is a flow diagram of a process for determining a signal disturbance, in accordance with this disclosure. FIG. 12 is discussed with reference to FIGS. 1-11 for example purposes only. High-pass filter 104 generates a filtered signal from a monitored signal (1202). Comparator 106 generates a compare result signal based on a comparison of the filtered signal and a threshold reference (1204). Asynchronous counter 110 generates a count value of threshold crossings based on the compare result signal (1206). Synchronizer 112 generates a synchronous output signal for storage at digital memory that is based on the count signal value (1208). Processing circuitry 114 determines that a disturbance has occurred at the monitored signal based on the synchronous output signal (1210).

The following examples may illustrate one or more aspects of the disclosure.

Example 1

A circuit for detecting a signal disturbance, the circuit comprising: a high-pass filter configured to generate a filtered signal from a monitored signal; a comparator configured to generate a compare result signal based on a comparison of the filtered signal and a threshold reference; an asynchronous counter configured to generate a count value of threshold crossings based on the compare result signal; a synchronizer configured to generate a synchronous output signal for storage at digital memory that is based on the count signal value; and processing circuitry configured to determine that a disturbance has occurred at the monitored signal based on the synchronous output signal.

Example 2

The circuit of example 1, wherein the processing circuitry is further configured to determine a corrective action based on the synchronous output signal.

Example 3

The circuit of any combination of examples 1-2, wherein the asynchronous counter is a gray counter configured to generate the count value using gray code.

Example 4

The circuit of any combination of examples 1-3, wherein the synchronizer comprises meta-stability protection for synchronization.

Example 5

The circuit of any combination of examples 1-4, comprising: an amplifier configured to amplify the filtered signal before output to the comparator 1.

Example 6

The circuit of any combination of examples 1-5, wherein the high-pass filter is configured to attenuate signals comprising a frequency of less ten times an operating frequency of the processing circuitry.

Example 7

The circuit of any combination of examples 1-6, wherein the comparator is a hysteresis comparator configured to transition from a first state to a second state when voltage at the filtered signal transitions from less than the threshold reference to voltage that is greater than the threshold reference plus a tolerance and configured to transition from the second state to the first state when voltage at the filtered signal transitions from greater than the threshold reference to voltage that is less than the threshold reference minus the tolerance.

Example 8

The circuit of any combination of examples 1-7, wherein, to generate the count value, the asynchronous counter is configured to increment the count value when the comparator transitions the compare result signal from a first state to a second state.

Example 9

The circuit of any combination of examples 1-8, wherein, to generate the count value, the asynchronous counter is configured to refrain from incrementing the count value when the comparator transitions the compare result signal from the second state to the first state.

Example 10

The circuit of any combination of examples 1-9, wherein, to generate the count value, the asynchronous counter is configured to increment the count value when the comparator transitions the compare result signal from the second state to the first state.

Example 11

The circuit of any combination of examples 1-10, comprising: a first datastore of the digital memory configured to store a first sample value of the synchronous output signal; and a second datastore of the digital memory configured to store a result of subtracting a second sample value of the synchronous output signal from the first sample value stored at the first datastore, wherein the second sample value occurs in the synchronous output signal after the first sample value.

Example 12

The circuit of any combination of examples 1-11, wherein, to determine that the disturbance has occurred, the processing circuitry is configured to determine that the disturbance has occurred based on the result stored at the second datastore.

Example 13

The circuit of any combination of examples 1-12, wherein, to determine that the disturbance has occurred, the processing circuitry is configured to generate a digital histogram based on the synchronous output signal.

Example 14

The circuit of any combination of examples 1-13, wherein the monitored signal comprises a gate driver output signal; wherein the monitored signal comprises a radar transmission sweep control signal; wherein the monitored signal comprises a radar receiver demodulated signal; or wherein the monitored signal comprises a Controller Area Network (CAN) signal.

Example 15

A method for detecting a signal disturbance, the method comprising: generating, with a high-pass filter, a filtered signal from a monitored signal; generating a compare result signal based on a comparison of the filtered signal and a threshold reference; generating a count value of threshold crossings based on the compare result signal; generating, based on the count signal value, a synchronous output signal that changes according to a clock cycle; and determining that a disturbance has occurred at the monitored signal based on the synchronous output signal.

Example 16

The method of example 15, further comprising: determining a corrective action based on the synchronous output signal.

Example 17

The method of any combination of examples 15-16, wherein generating the count value comprises generating the count value using gray code.

Example 18

The method of any combination of examples 15-17, wherein the monitored signal comprises a gate driver output signal; wherein the monitored signal comprises a radar transmission sweep control signal; wherein the monitored signal comprises a radar receiver demodulation signal; or wherein the monitored signal comprises a Controller Area Network (CAN) signal.

Example 19

A system comprising: a device configured to generate a monitored signal; a high-pass filter configured to generate a filtered signal from the monitored signal; a comparator configured to generate a compare result signal based on a comparison of the filtered signal and a threshold reference; an asynchronous counter configured to generate a count value of threshold crossings based on the compare result signal; a synchronize configured to generate a synchronous output signal for storage at digital memory that is based on the count signal value; and processing circuitry configured to determine that a disturbance has occurred at the monitored signal based on the synchronous output signal.

Example 20

The system of example 19, wherein device is a gate driver and wherein the monitored signal comprises a gate driver output signal; wherein the device is a radar sweep controller and wherein the monitored signal comprises a radar transmission sweep control signal; wherein the device is a radar signal demodulator and wherein the monitored signal comprises a radar receiver demodulated signal; or wherein the device is a Controller Area Network (CAN) device and wherein the monitored signal comprises a CAN signal.

Various aspects have been described in this disclosure. These and other aspects are within the scope of the following claims.

The invention claimed is:
1. A circuit for detecting a signal disturbance, the circuit comprising:
   a high-pass filter configured to generate a filtered signal from a monitored signal;
   a comparator configured to generate a compare result signal based on a comparison of the filtered signal and a threshold reference;
   an asynchronous counter configured to generate a count value of threshold crossings based on the compare result signal;

a synchronizer configured to generate a synchronous output signal for storage at digital memory that is based on the count signal value; and processing circuitry configured to determine that a disturbance has occurred at the monitored signal based on the synchronous output signal.

2. The circuit of claim 1, wherein the processing circuitry is further configured to determine a corrective action based on the synchronous output signal.

3. The circuit of claim 1, wherein the asynchronous counter is a gray counter configured to generate the count value using gray code.

4. The circuit of claim 1, wherein the synchronizer comprises meta-stability protection for synchronization.

5. The circuit of claim 1, comprising:
an amplifier configured to amplify the filtered signal before output to the comparator.

6. The circuit of claim 1, wherein the high-pass filter is configured to attenuate signals comprising a frequency of less ten times an operating frequency of the processing circuitry.

7. The circuit of claim 1, wherein the comparator is a hysteresis comparator configured to transition from a first state to a second state when voltage at the filtered signal transitions from less than the threshold reference to voltage that is greater than the threshold reference plus a tolerance and configured to transition from the second state to the first state when voltage at the filtered signal transitions from greater than the threshold reference to voltage that is less than the threshold reference minus the tolerance.

8. The circuit of claim 1, wherein, to generate the count value, the asynchronous counter is configured to increment the count value when the comparator transitions the compare result signal from a first state to a second state.

9. The circuit of claim 8, wherein, to generate the count value, the asynchronous counter is configured to refrain from incrementing the count value when the comparator transitions the compare result signal from the second state to the first state.

10. The circuit of claim 8, wherein, to generate the count value, the asynchronous counter is configured to increment the count value when the comparator transitions the compare result signal from the second state to the first state.

11. The circuit of claim 1, comprising:
a first datastore of the digital memory configured to store a first sample value of the synchronous output signal; and
a second datastore of the digital memory configured to store a result of subtracting a second sample value of the synchronous output signal from the first sample value stored at the first datastore, wherein the second sample value occurs in the synchronous output signal after the first sample value.

12. The circuit of claim 11, wherein, to determine that the disturbance has occurred, the processing circuitry is configured to determine that the disturbance has occurred based on the result stored at the second datastore.

13. The circuit of claim 1, wherein, to determine that the disturbance has occurred, the processing circuitry is configured to generate a digital histogram based on the synchronous output signal.

14. The circuit of claim 1,
wherein the monitored signal comprises a gate driver output signal;

wherein the monitored signal comprises a radar transmission sweep control signal;

wherein the monitored signal comprises a radar receiver demodulated signal; or wherein the monitored signal comprises a Controller Area Network (CAN) signal.

15. A method for detecting a signal disturbance, the method comprising:
generating, with a high-pass filter, a filtered signal from a monitored signal;
generating a compare result signal based on a comparison of the filtered signal and a threshold reference;
generating a count value of threshold crossings based on the compare result signal;
generating, based on the count signal value, a synchronous output signal that changes according to a clock cycle; and
determining that a disturbance has occurred at the monitored signal based on the synchronous output signal.

16. The method of claim 15, further comprising:
determining a corrective action based on the synchronous output signal.

17. The method of claim 15, wherein generating the count value comprises generating the count value using gray code.

18. The method of claim 15,
wherein the monitored signal comprises a gate driver output signal;
wherein the monitored signal comprises a radar transmission sweep control signal;
wherein the monitored signal comprises a radar receiver demodulation signal; or
wherein the monitored signal comprises a Controller Area Network (CAN) signal.

19. A system comprising:
a device configured to generate a monitored signal;
a high-pass filter configured to generate a filtered signal from the monitored signal;
a comparator configured to generate a compare result signal based on a comparison of the filtered signal and a threshold reference;
an asynchronous counter configured to generate a count value of threshold crossings based on the compare result signal;
a synchronize configured to generate a synchronous output signal for storage at digital memory that is based on the count signal value; and
processing circuitry configured to determine that a disturbance has occurred at the monitored signal based on the synchronous output signal.

20. The system of claim 19,
wherein device is a gate driver and wherein the monitored signal comprises a gate driver output signal;
wherein the device is a radar sweep controller and wherein the monitored signal comprises a radar transmission sweep control signal;
wherein the device is a radar signal demodulator and wherein the monitored signal comprises a radar receiver demodulated signal; or
wherein the device is a Controller Area Network (CAN) device and wherein the monitored signal comprises a CAN signal.

* * * * *